(12) United States Patent
Lowis

(10) Patent No.: US 7,425,752 B2
(45) Date of Patent: Sep. 16, 2008

(54) SEMICONDUCTOR DEVICE CHANNEL TERMINATION

(76) Inventor: Royce Lowis, 20 Lostock Avenue, Poynton, Stockport (GB) SK12 1DR ( * ) Notice: Subject to any disclaimer, the term of this patent is extended or adjusted under 35 U.S.C. 154(b) by 55 days.

(21) Appl. No.: 10/534,329

(22) PCT Filed: Oct. 30, 2003

(86) PCT No.: PCT/IB03/04836

§ 371 (c)(1), (2), (4) Date: May 9, 2005

(87) PCT Pub. No.: WO2004/044977

PCT Pub. Date: May 27, 2004

(65) Prior Publication Data

US 2006/0071294 A1  Apr. 6, 2006

(30) Foreign Application Priority Data

Nov. 12, 2002 (GB) ................... 0226402.6

(51) Int. Cl.
*H01L 27/088* (2006.01)
(52) U.S. Cl. .................... 257/519; 257/376; 257/398; 257/E29.016; 257/E91.551; 438/298; 438/450

(58) Field of Classification Search .............. 257/49, 257/376, 398–400, 519, 648, E29.016, E21.551; 438/298, 450
See application file for complete search history.

(56) References Cited

U.S. PATENT DOCUMENTS

| | | | | |
|---|---|---|---|---|
| 4,523,369 A * | 6/1985 | Nagakubo | .................... | 438/433 |
| 4,729,006 A * | 3/1988 | Dally et al. | .................. | 257/372 |
| 5,130,268 A * | 7/1992 | Liou et al. | .................. | 438/425 |
| 5,801,082 A | 9/1998 | Tseng | | |
| 5,904,541 A * | 5/1999 | Rho et al. | .................... | 438/433 |
| 6,096,612 A * | 8/2000 | Houston | ..................... | 438/296 |
| 6,355,540 B2 | 3/2002 | Wu | | |

* cited by examiner

*Primary Examiner*—Phat X. Cao
*Assistant Examiner*—Abul Kalam
(74) *Attorney, Agent, or Firm*—Peter Zawilski

(57) ABSTRACT

A semiconductor device has a channel termination region for using a trench (30) filled with field oxide (32) and a channel stopper ring (18) which extends from the first major surface (8) through p-well (6) along the outer edge (36) of the trench (30), under the trench and extends passed the inner edge (34) of the trench. This asymmetric channel stopper ring provides an effective termination to the channel (10) which can extend as far as the trench (30).

10 Claims, 4 Drawing Sheets

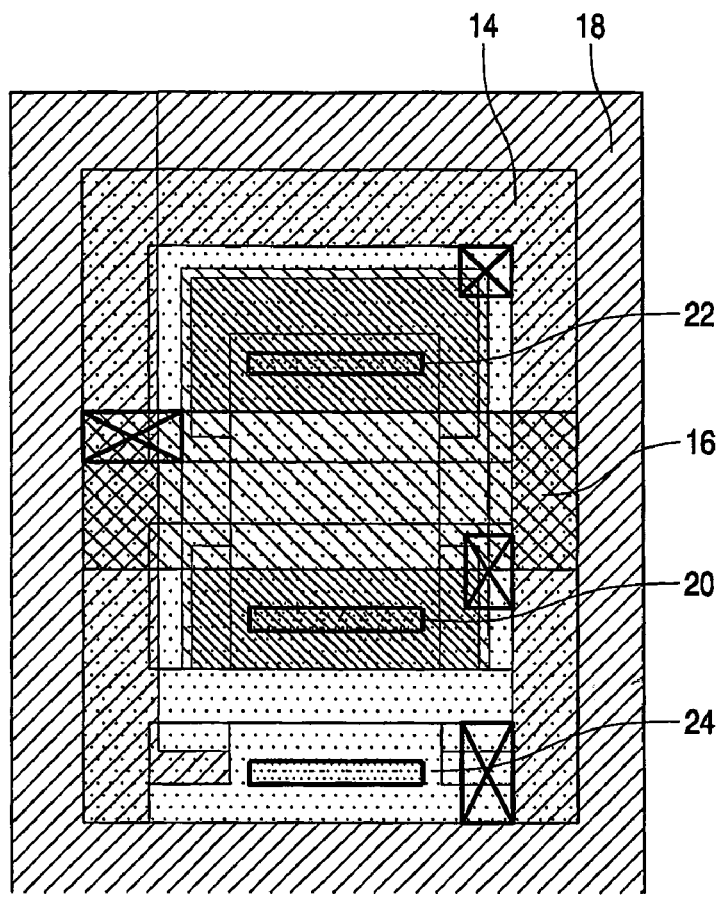
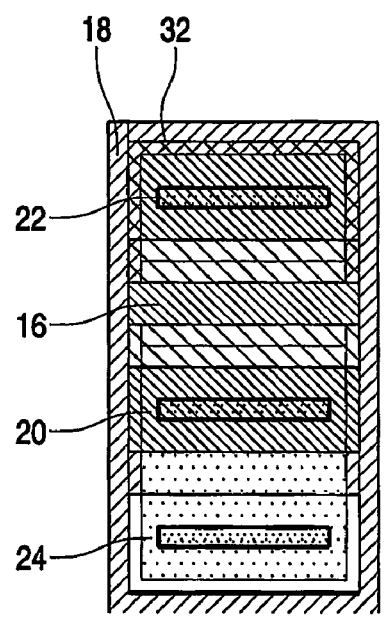
FIG.7a  FIG.7b
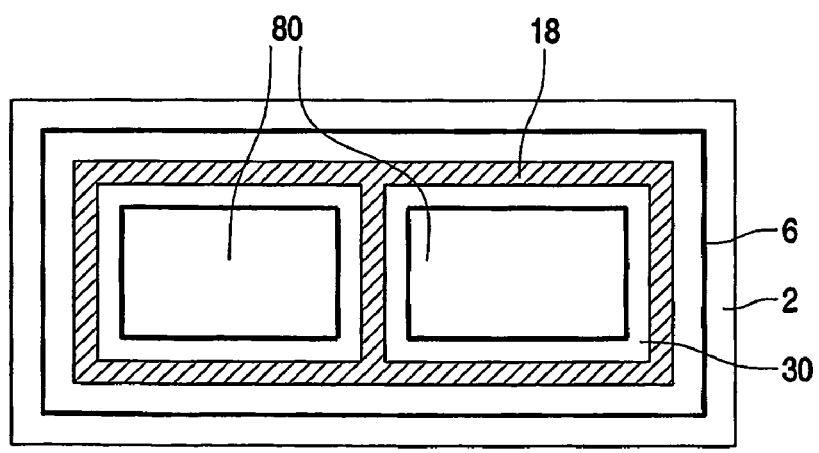
FIG.8

SEMICONDUCTOR DEVICE CHANNEL TERMINATION

The invention relates to a semiconductor device having a channel termination structure and a method of manufacturing a channel termination structure.

The layout of a conventional low voltage n-channel metal oxide semiconductor (nMOS) transistor is illustrated in FIGS. 1 and 2. An n+substrate 2 has an n-epilayer 4 grown on top of it. A p-well 6 is formed at the first major surface 8 of the substrate 2 and over epilayer 4. A channel region 10 at the first major surface 8 has a gate oxide 12 formed upon it. A polysilicon gate 16 is provided over the gate oxide 12.

As will be appreciated, in general more than one transistor is provided on a substrate and it is therefore necessary to isolate the transistor from neighbouring transistors. The conventional structure for doing so has two components, a field oxide 14 and a heavily doped channel stopper ring in the form of a p-type diffusion 18. The field oxide 14 is provided laterally around the channel region 10 on the first major surface 8, as can be seen more clearly in FIG. 2. The heavily doped p-type diffusion 18 is implanted into the first major surface 8 laterally around the field oxide.

N-type source and drain diffusions 20, 22 define the source and drain. A back gate contact 24 contacts the p-well 6.

In operation, voltage is applied to the gate 16 and current flows through the channel region 10 between source and drain diffusions 20, 22. Little current flows in the region under the field oxide 14 since the field oxide 14 is much thicker than the gate oxide 12 and so the threshold voltage is much higher in this region.

The channel stopper ring 18 prevents n-channels from connecting the source or drain diffusions 20, 22 to like source or drain diffusions in other transistors. For example, a metal track overlapping the drain region might have a sufficient positive bias to exceed the threshold voltage of the thick field oxide section and thus cause a channel connecting adjacent transistors together. The high doping in the channel stopper ring 18 prevents this by greatly increasing the threshold voltage in the peripheral region.

One disadvantage of this structure is that it does not give a planar surface.

A further significant problem with this prior art circuit is that the area of the transistor is rather large. In particular, the area occupied by the edge structure including the field oxide 14 and channel stopper well 18 is a large fraction of the area of the device. The field oxide 14 in particular must occupy a large area because the design rules for conventional processes require a large width of field oxide to allow for the slope on the edge of the field oxide to allow for good step coverage in subsequently deposited layers, and sufficient top contact area to ensure that the photoresist stripe is wide enough not to become disconnected during the etching process.

Accordingly, a shallow trench isolation (STI) technique was introduced. STI involves etching a trench and then implanting a channel stopper into the bottom of the trench. A deposited dielectric layer is then used to fill the trench. For example, U.S. Pat. No. 6,355,540 defines a process in which a trench is first defined using a hard mask of oxide and silicon nitride. A channel stopper is then implanted into the bottom of the trench. A layer of silicon oxynitride is formed on the side walls of the trench, and a dielectric layer deposited to fill the trench. Excess dielectric is then removed using a chemical-mechanical polishing technique. This is a complex and expensive process route to form the required channel stopper.

There thus remains a need for a method of manufacture of a semiconductor device to provide isolation between adjacent devices and a semiconductor device so made.

According to the invention there is provided a semiconductor device comprising:

a semiconductor substrate of first conductivity type having opposed first and second major surfaces;

a semiconductor component defined adjacent to the first major surface;

a trench extending from the first major surface into the semiconductor substrate, having a first side facing the semiconductor component and a second side opposed to the semiconductor component;

a thermal oxide filling the trench; and a channel stop diffusion of second conductivity type extending from the first major surface on the second side of the trench opposed to the semiconductor component under the trench from the second side to the first side.

Accordingly, in the invention, the trench is refilled with thermal oxide, which is generally of higher quality than deposited oxide.

It would not be possible to simply fill a shallow trench in a prior art STI structure with thermal oxide. If thermal oxide were grown in a trench having a channel stopper directly implanted under the trench, the thermal oxidation would consume much of the silicon and implanted dopant for the channel stopper. Moreover, if the dopant were boron, then the boron would preferentially segregate into the oxide. The dose for the channel stopper could be increased, but this would result in a higher concentration of dopant atoms diffusing sideways into the active regions for the components and this could in turn lead to an unacceptable increase in the junction leakage current. For this reason, prior art arrangements use deposited oxide, typically deposited using chemical vapour deposition (CVD). Such processes are both more expensive and produce worse oxide than thermal oxide.

A further advantage of the approach of the invention is that the outer sidewall of the trench is protected by a relatively highly doped and hence effective channel stopper, whilst the doping concentration on the side of the trench adjacent to the active component has a much lower doping concentration, and so the active channel region is not excessively affected by the channel stop.

The channel stop diffusion according to the invention takes up much less area than the conventional approaches discussed above that use a channel stop diffusion adjacent to a field oxide layer.

The semiconductor device is easy to manufacture using conventional equipment. Preferably, the substrate is of silicon.

It should be noted that in this specification the term "semiconductor substrate" includes any epilayer or doped regions formed over the surface of the substrate, but excludes wells of opposite conductivity type formed in local regions of the surface of the substrate.

The invention is particularly suitable to semiconductor devices formed in a well of a second conductivity type formed in the substrate of first conductivity type. In these structures, the trench isolation structures mentioned above, for example in U.S. Pat. No. 6,355,540, have significant disadvantages, for any given dopant concentration. Indeed, these prior documents do not suggest that they are suitable in such a structure.

Firstly, the channel stop diffusions in the prior art documents are formed only under the trench, in a region that in a well-type structure is of the opposite conductivity type to that of the channel stop diffusion. Hence if the channel stop according to the prior art documents discussed were used under a trench extending through the well into the substrate the effects of the dopant in the substrate would tend to cancel out rather than enhance the effect of the channel stop diffusion.

Secondly, the aim of the channel stop diffusion is to prevent a channel being formed by stray voltages. The high doping possible by keeping the channel stop diffusion spaced well away from the channel, mostly on the opposite side of the trench to the channel, assists this goal.

Thirdly, the arrangement according to the invention allows the semiconductor component to extend right up to the trench. This maximises the usable area of the device.

Further, the asymmetric structure of the channel stop diffusion allows there to be a high concentration of dopant from the first major surface on the outside of the trench, away from the channel, without the need for a high concentration of dopant in the well which could adversely affect the properties of the semiconductor component.

In preferred embodiments the trench surrounds the component. This is more convenient than alternative arrangements, still possible, in which the trench may surround, for example, three sides of the component and the edge of a well may terminate the fourth side of the component.

Preferably, a number of semiconductor components are provided. Accordingly, as well as the component and trench arrangement discussed above, there may be further provided a second component adjacent to the first component; a second trench around the second component extending from the first major surface into the semiconductor substrate, having a first side facing the second component and a second side opposed to the second component; and an insulator filling the second trench; wherein the channel stop diffusion extends from the first major surface between the first and second trenches under each of the first and second trenches. The trench and channel stop diffusion effectively electrically isolate the first component from the second, and the sharing of the channel stop diffusion between first and second components minimises the area used.

The semiconductor component is preferably an insulated gate field effect transistor having longitudinally spaced source and drain implants in the well defining a channel region at the first major surface between the source and drain implants;

A key problem in structures having FETs formed in wells is the existence of the parasitic bipolar transistor with its base the well, one of the source and drain forming the emitter and the substrate forming the collector. The field oxide region sucks dopant out of the well during its formation which lowers the dopant concentration in the well. This can lead to breakdown in the parasitic bipolar transistor if the depletion region at the well punches through to the source or drain diffusions. The channel stop diffusion according to the invention assists in preventing this effect by extending under the trench to replace dopant sucked out of the well during field oxide formation, to reduce the size of the depletion region for any given voltage between well and source or drain, and hence reduce the risk of such breakdown.

To form an insulated gate transistor as the component there may be provided a gate oxide over the channel region of the first major surface and a gate over the gate oxide, wherein the gate oxide and gate span the channel region from a trench on one side of the channel region to a trench on the other side of the channel region so that the channel region extends laterally between the trenches. This allows maximum utilisation of chip area. In contrast, in prior art approaches using "bird's beak" field oxide layers, the "beak" of the "bird's beak" means that there is a slow increase in threshold voltage away from the centre of the channel so that the edge of the channel adjacent to the termination structure is not effectively used.

The source and drain implants discussed above constitute a first MOS transistor. Further source and drain implants forming further MOS transistors may be formed, likewise surrounded by a trench and a channel stop diffusion. The channel stop diffusions formed for adjacent transistors may be shared, thus one diffusion may be formed between trenches of two adjacent transistors to act as the channel stop diffusion for both of the adjacent transistors.

In another aspect, there is provided a method of manufacturing a semiconductor device, including providing a substrate of a first conductivity type extending between first and second major surfaces;

forming a trench around a component region, the trench extending from the first major surface into the substrate;

forming thermal oxide filling the trench;

implanting a dopant of the second conductivity type along the outer edge of the trench opposed to the component region but not along the inner edge of the trench facing the channel region; and diffusing the dopant so that it extends underneath the trench.

The method of manufacture is readily compatible with existing processes.

The method preferably further includes the step of implanting a well of a second conductivity type opposite to the first conductivity type at the first major surface. In this case, the component may be formed in the well and the trench may extend through the well into the substrate.

The step of implanting a dopant of second conductivity type may be carried out by forming a mask having an opening above the trench, the opening being offset away from the component region. The channel stop dopant may then be implanted using the mask.

The step of diffusing the dopant is conveniently carried out by using heat treatment. Such heat treatment steps may be required in any event, so the step of diffusing the dopant often adds no steps to the process.

The mask for the channel stop diffusion may be formed using a reduction stepper technology to allow very small devices to be made.

For a better understanding of the invention, a prior art structure and embodiments of the invention will now be described, purely by way of example, with reference to the accompanying drawings, in which:

FIG. 7 is a comparative top view showing the relative areas taken up by the devices according to FIGS. 1 and 3; and FIG. 8 illustrates a second embodiment of the invention having two transistors.

Figure 3:
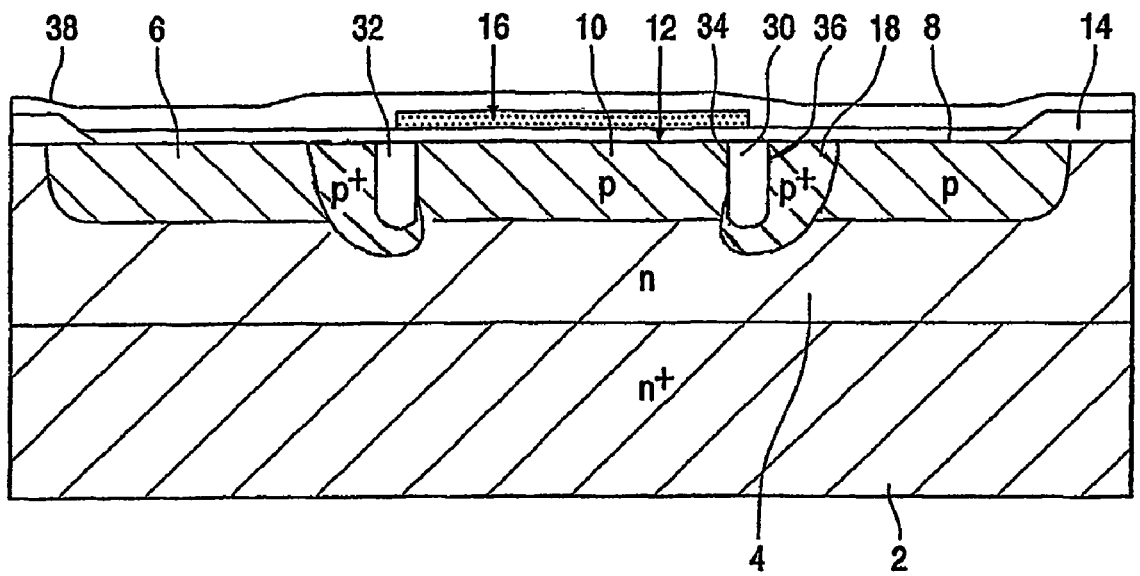
FIG. 3 is a cross-sectional side view of a first embodiment of a transistor structure according to the invention.

FIG. 3 shows a lateral nMOS field effect transistor according to the invention. An n-epilayer 4 on an n+silicon substrate 2 has a p-well 6 formed therein at a first major surface 8. A channel region 10 at the first major surface 8 has a gate oxide 12 formed thereon and a polysilicon gate 16 is formed over the gate oxide. Trenches 30 are provided on either side of the channel region 10 and are filled with thermal field oxide 32. A channel stop diffusion 18 is formed extending from the first major surface 8 down the outer edge 36 of the trench 30 facing away from the channel region 10. The diffusion 18 extends under the trench 30 as far as the inner edge 34 of the trench 30. It will be noted that the polysilicon gate 16 overlaps the inner edge 34 of the trench 30. A passivation layer 38 is provided above these components to finish the device. FIG. 3 further illustrates field oxide layer 14 arranged at the lateral edges of the p-well 6.

Figure 4:
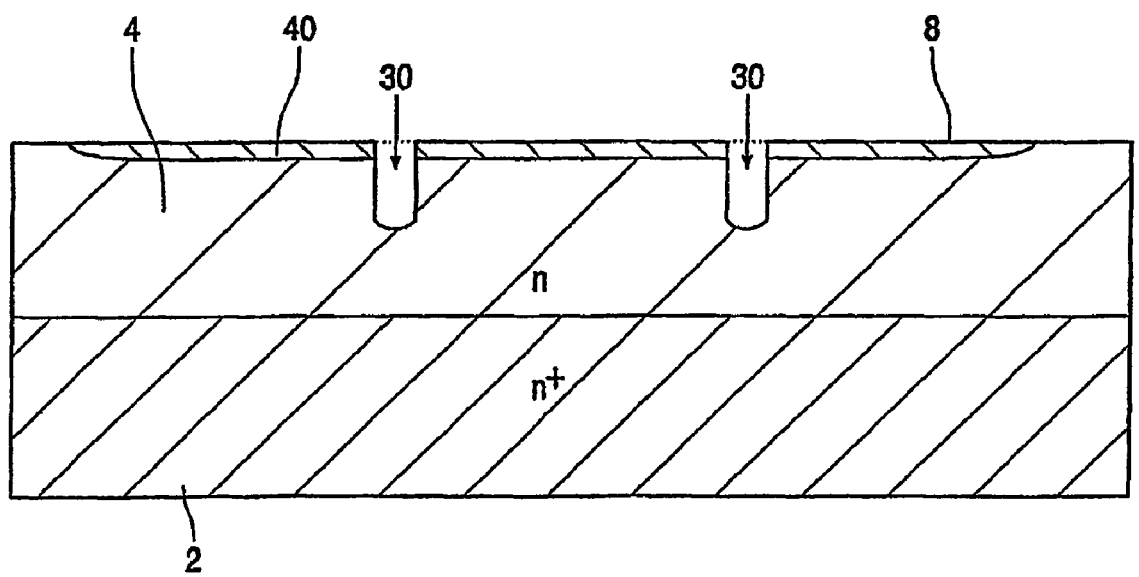
FIGS. 4, 5 and 6 are cross-sectional side views illustrating stages in the manufacture of the semiconductor device of FIG. 3.
Figure 5:
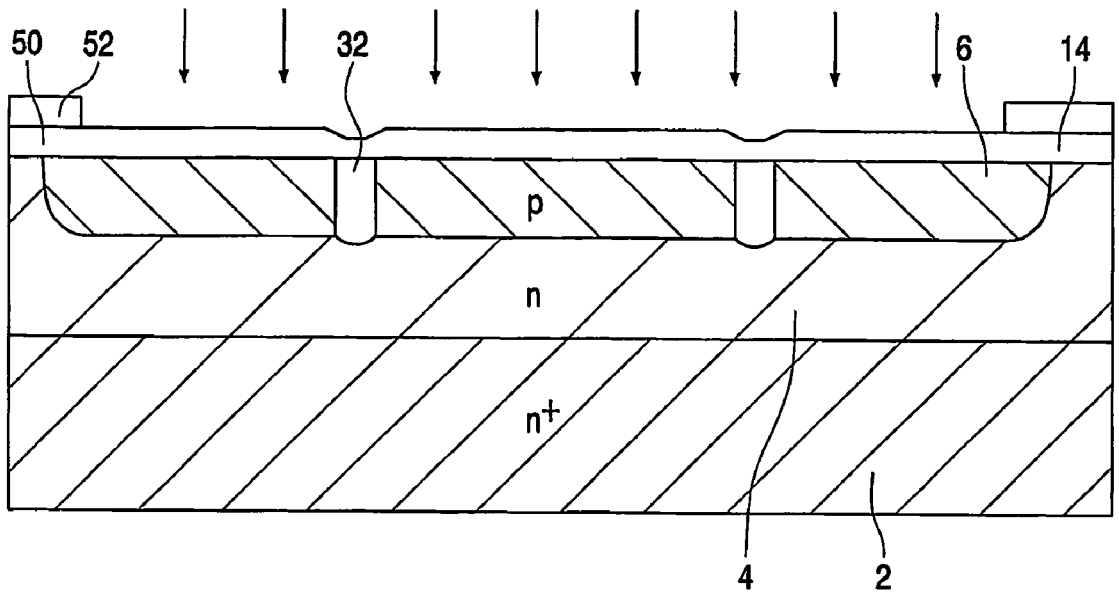

The manufacture of this structure will now be described with reference to FIGS. 4 to 6. Firstly the n-epilayer 4 is grown on the n+substrate 2. Then, a p-well implant 40 is implanted into the first major surface 8 on top of the epilayer 4. Trenches 30 are then formed by etching to result in the structure shown in FIG. 4. In the example, the trenches are 2 μm deep and 1 μm across. Thermal field oxidation is then carried out forming thermal oxide (field oxide) 50 both on the first major surface 8 and also within the trenches 30. The step of field oxidation diffuses the p-well implant 40 to define the doping profile in the p-well 6 as can be ascertained by a comparison of FIGS. 4 and 5. A planarisation etch is then carried out to remove the field oxide 50 on the first major surface 8 leaving the field oxide 32 within the trenches 30, as well as field oxide 14 around the outside of the p-well 6.

Figure 6:
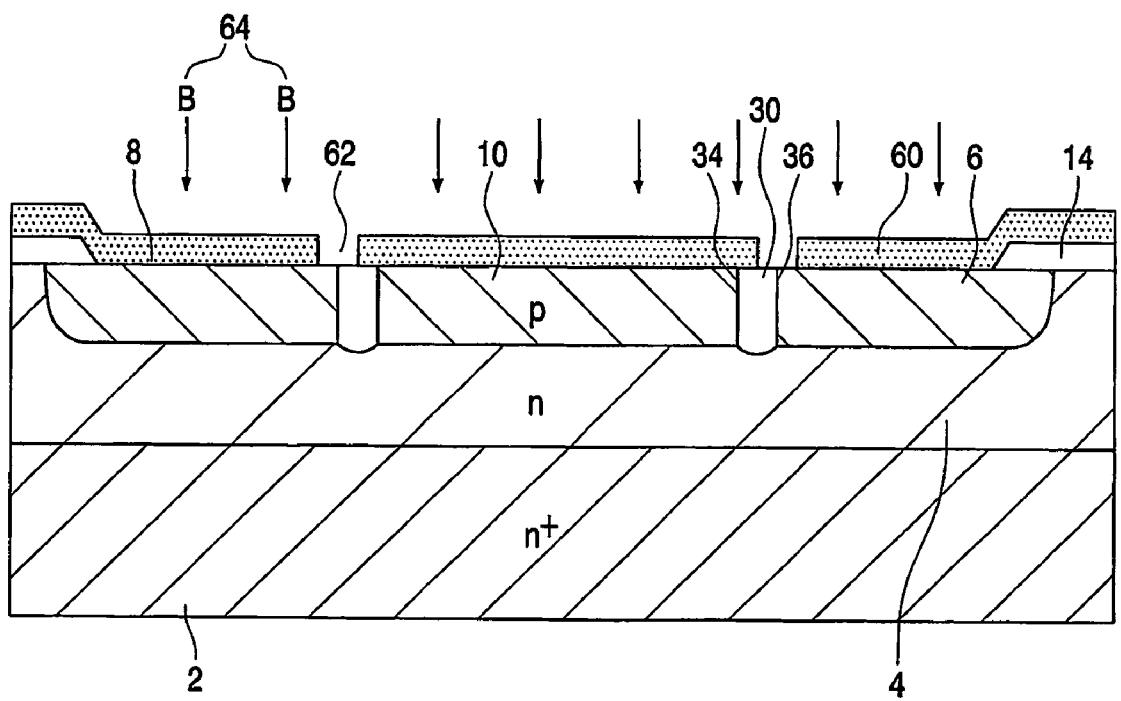

Next, resist 60 is deposited on the first major surface 8 and patterned using a reduction stepper to leave openings 62 aligned with but slightly offset outwards from the trenches 30, as shown in FIG. 6. The openings 62 are arranged over the outer edge 36 of the trench 30, i.e. the edge facing away from the channel region 10, but do not extend as far as the inner edges 34 facing the channel region 10. Boron 64 is then implanted through holes 62 in resist 60 to provide the channel stop diffusion. The boron is implanted at a dose $1\times10^{14}$ to $1\times10^{15}$ atoms per square centimetre. During subsequent heat treatments, the implanted boron 64 diffuses past and under the bottom of the trench 30 under the inner edge 34 of the trench so that the diffusion extends a short distance under the region covered by the polysilicon gate 16 as illustrated in FIG. 3.

This sideways diffusion replaces the boron sucked out from the p-well 6 during the field oxidation process.

Figure 1:
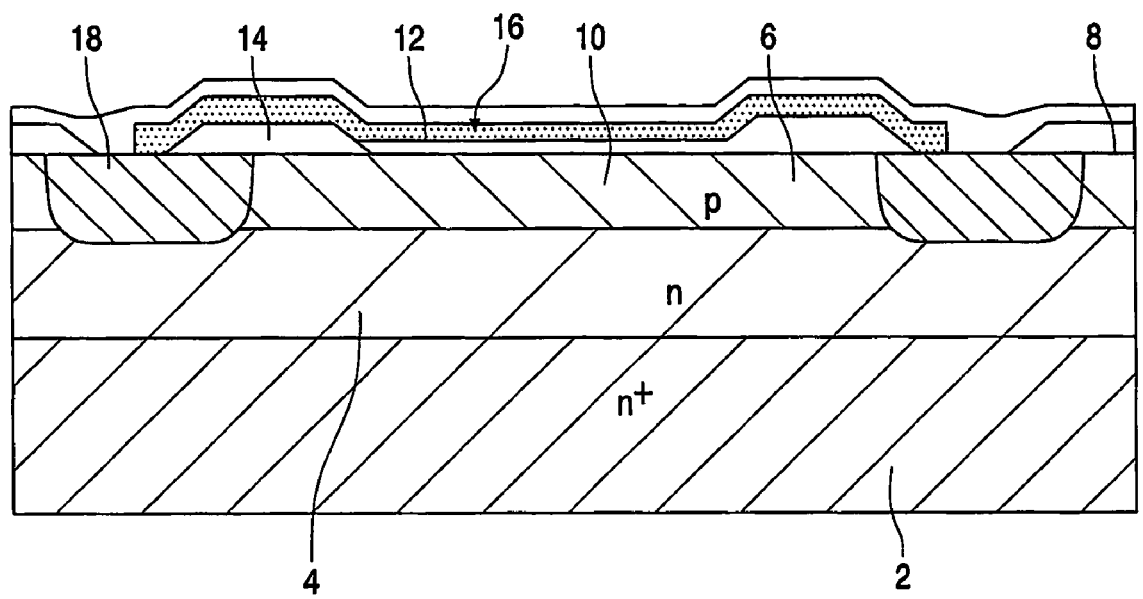
FIG. 1 shows a cross-sectional side view of a prior art transistor structure.
Figure 2:
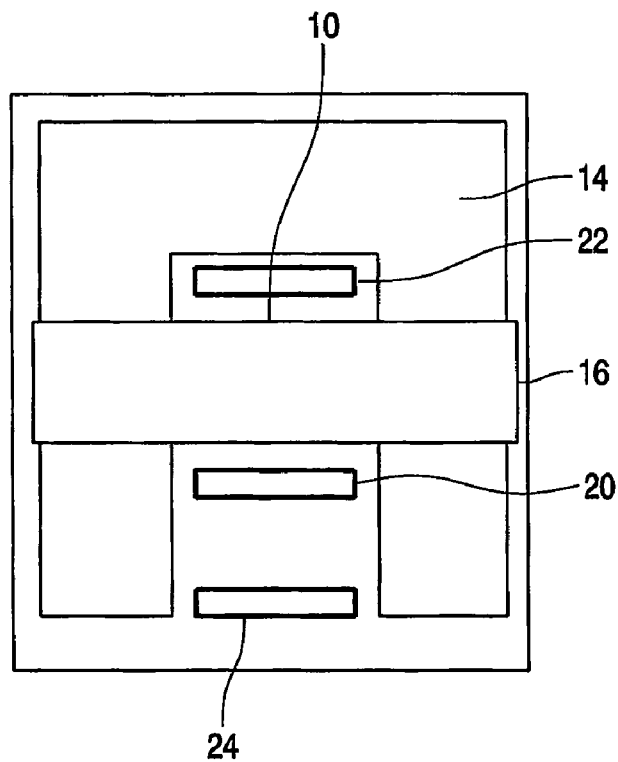
FIG. 2 is a top view of the prior art structure of FIG. 1.

FIG. 7 illustrates the area occupied by a prior art device of FIGS. 1 and 2 in FIG. 7a and the area on the same scale occupied by the device according to the invention in FIG. 7b. It will be noted that there is very much less area taken up by the new device. This is partly because of the small size required for the edge termination structure formed by the field oxide 32 and channel stopper ring 18, and this is helped by the fact that the polysilicon gate 16 and accordingly the channel 10 can extend right up to the trenches 30. Indeed, the polysilicon gate 16 overlaps the inner edge 34 of the trench 30 as previously illustrated in FIG. 3.

The above figures show only a single transistor. However, it will be appreciated that in practice many transistors may be formed in the p-well 6. FIG. 8 illustrates this—a number of transistors 80 are formed, each having a source and drain diffusion 20, 22 surrounded by a trench 30 having a channel stopper arranged on the outside of and underneath the trench 30. It will be noted that in regions 84 between adjacent trenches 30, a single diffusion 18 function as the channel stop 18 for adjacent transistors 80. Although FIG. 8 illustrates two transistors, in practice there may be many more.

In use, the combination of field oxide 32 in trench 30 and the channel stopper ring 18 forms an effective isolation of n-type transistors arranged in the p-well 6.

It will be noted that the diffusion 18 extends under the inner edge 34 of trench 30 and this replaces boron sucked out of the p-well 6 in this region during field oxidation. This reduces the chance of breakdown of the parasitic field effect transistor having its base the p-well 6, its emitter the source or drain diffusion 20, 22 and its collector the substrate 2 and epilayer 4. The channel stop diffusion is needed to boost the boron doping in the P-well 6 base regions adjacent to the trenches. During the thermal oxidation process the boron in the P-well diffusion partially segregates into the field oxide. This loss of boron increases the resistance in the P-well diffusion, which is the base of a parasitic vertical bipolar transistor. It is very important that this bipolar never turns on, for example, if a high dV/dt is applied to its collector-base junction, otherwise permanent damage could occur to the device. The channel stop diffusion extends into the boron depleted P-well region and effectively reduces the local base resistance and gain of the parasitic bipolar.

The channel stop implant can be masked using a patterned layer of resist, which can readily defined using standard photolithographic techniques, no other special masking arrangements or materials are required. The channel stop diffusion does not reach the surface of the silicon in the active channel region and thus avoids introducing any variance in the local threshold voltage and effective channel width of the component. This ensures good matching of components, such as nMOS transistors, which are used in current mirror and comparator circuits.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

Although the above has been described with reference to an n-channel device in a p-well, the skilled person will readily appreciate that the same technique could be used for a p-type transistor in an n-well, and indeed to p-or n-channel devices formed directly in a substrate. Further, the compact termination structure can be applied to many other types of component used in cMOS and other circuits, not just transistors, including pMOS transistors, diffused "n" type resistors, diffused "p" type resistors, diodes in the bulk silicon, pn and pnp bipolar transistors and capacitors. Depending on the type of component being formed, the skilled person will realize that the appropriate dopant type must be used for the channel stopper ring. For example, a lateral pMOS transistor may use an n dopant such as phosphorus for the channel stopper instead of the p dopant as described above.

The invention claimed is:

1. A semiconductor device comprising:
    a semiconductor substrate of a first conductivity type having opposed first and second major surfaces;
    a semiconductor component defined adjacent to the first major surface;
    a trench extending from the first major surface into the semiconductor substrate, having an inner side facing the semiconductor component and an outer side opposed to the semiconductor component;

a thermal oxide filling the trench; and an asymmetric channel stop diffusion of a second conductivity type opposite to the first conductivity type, the asymmetric channel stop diffusion extending from the first major surface on the outer side of the trench and further extending under the trench from the outer side to the inner side of the trench to define an area of higher doping concentration adjacent to the outer side of the trench and an area of lower doping concentration adjacent to the inner side of the trench.

2. The semiconductor device of claim 1, further comprising a well of the second conductivity type implanted into the first major surface of the semiconductor substrate; wherein the trench extends from the first major surface through the well into the substrate.

3. The semiconductor device of claim 2, wherein the semiconductor component is a first transistor, the semiconductor device further comprising:

a second transistor adjacent to the first transistor;

a second trench surrounding the second transistor extending from the first major surface into the semiconductor substrate, having an inner side facing the second transistor and an outer side opposed to the second transistor; and a thermal oxide filling the second trench;

wherein the channel stop diffusion extends from the first major surface between the outer side of the trench and the outer side of the second trench, the channel stop diffusion further extending under the second trench to the inner side of the second trench.

4. The semiconductor device of claim 2, wherein the semiconductor component is an insulated gate field effect transistor having longitudinally spaced source and drain implants in the well defining a channel region at the first major surface between the source and drain implants.

5. The semiconductor device of claim 4, further comprising a gate oxide over the channel region on the first major surface and a gate over the gate oxide, wherein the trench surrounds the insulated gate field effect transistor and wherein the gate oxide and the gate span the channel region from the trench on one side of the channel region to the trench on the other side of the channel region so that the channel region extends laterally between the trench.

6. The semiconductor device of claim 4, wherein the trench surrounds the semiconductor component and the channel region extends from one side of the trench up to the other side of the trench.

7. The semiconductor device of claim 1, wherein the trench is completely filled with the thermal oxide.

8. The semiconductor device of claim 3, wherein the channel stop diffusion surrounds the trench and the second trench.

9. The semiconductor device of claim 5, further comprising a passivation layer on the first major surface of the semiconductor substrate, the passivation layer extending over the gate, the trench, and the channel stop diffusion.

10. The semiconductor device of claim 1, wherein in the trench extends approximately 2 μm from the first major surface into the semiconductor substrate and the trench has a width of approximately 1 μm.

* * * * *